US011360132B2

(12) United States Patent
Gizelar

(10) Patent No.: US 11,360,132 B2
(45) Date of Patent: Jun. 14, 2022

(54) UTILITY COVER FOR USE WITH AUTOMATED METERING EQUIPMENT

(71) Applicant: Hubbell Incorporated, Shelton, CT (US)

(72) Inventor: Angela Michelle Gizelar, Knoxville, TN (US)

(73) Assignee: HUBBELL INCORPORATED, Shelton, CT (US)

( * ) Notice: Subject to any disclaimer, the term of this patent is extended or adjusted under 35 U.S.C. 154(b) by 166 days.

(21) Appl. No.: 16/340,104

(22) PCT Filed: Sep. 22, 2017

(86) PCT No.: PCT/US2017/052903
§ 371 (c)(1),
(2) Date: Apr. 6, 2019

(87) PCT Pub. No.: WO2018/067326
PCT Pub. Date: Apr. 12, 2018

(65) Prior Publication Data
US 2020/0025811 A1    Jan. 23, 2020

Related U.S. Application Data

(60) Provisional application No. 62/405,091, filed on Oct. 6, 2016.

(51) Int. Cl.
*G01R 22/06* (2006.01)
*H02G 3/08* (2006.01)

(52) U.S. Cl.
CPC .......... *G01R 22/065* (2013.01); *H02G 3/081* (2013.01)

(58) Field of Classification Search
CPC ...... H01Q 1/04; G01R 22/065; G01R 22/063; H02G 3/081; H02B 1/46; E02D 29/14; E02D 29/1472; E02D 29/1481
See application file for complete search history.

(56) References Cited

U.S. PATENT DOCUMENTS

| 317,153 A | 5/1885 | Lowrie |
| 2,608,085 A | 8/1952 | Castle |
| 2,697,389 A | 12/1954 | Heckman |
| 3,530,696 A | 9/1970 | Dunmire |

(Continued)

FOREIGN PATENT DOCUMENTS

| CN | 2764821 | 3/2006 |
| JP | 1161867 | 3/1999 |

(Continued)

OTHER PUBLICATIONS

International Search Report and Written Opinion mailed in PCT/US2017/05903 dated Nov. 24, 2017.

(Continued)

*Primary Examiner* — Son T Le
*Assistant Examiner* — Dustin R Dickinson
(74) *Attorney, Agent, or Firm* — Wissing Miller LLP

(57) ABSTRACT

A utility cover assembly includes a base unit made at least partially from a first material, a cover made at least partially from a second material capable of acting as a tuning plate for electromagnetic energy and an insert ring made at least partially from a third material and arranged between the base unit and the cover.

17 Claims, 5 Drawing Sheets

(56) References Cited

U.S. PATENT DOCUMENTS

| | | | |
|---|---|---|---|
| 4,834,574 A | 5/1989 | Bowman | |
| 4,969,771 A | 11/1990 | Bowman | |
| 5,123,776 A | 6/1992 | Lang | |
| 5,240,346 A | 8/1993 | Yin | |
| 5,583,492 A | 12/1996 | Nakanishi | |
| 6,177,883 B1 * | 1/2001 | Jennetti | G08C 17/02 340/870.02 |
| 6,300,907 B1 * | 10/2001 | Lazar | H01Q 1/2233 343/700 MS |
| 6,414,605 B1 | 7/2002 | Walden | |
| 7,619,878 B1 | 11/2009 | Cook | |
| 8,258,977 B1 | 9/2012 | Montestruque | |
| 9,258,992 B2 | 2/2016 | Shefer | |
| 2001/0011009 A1 * | 8/2001 | Harada | G02B 6/4451 455/40 |
| 2003/0178425 A1 | 9/2003 | McKinnon | |
| 2004/0042849 A1 | 3/2004 | Jurich | |
| 2007/0194493 A1 | 8/2007 | Jurich | |
| 2008/0050175 A1 | 2/2008 | Brady | |
| 2008/0074283 A1 | 3/2008 | Verkleeren | |
| 2010/0019912 A1 | 1/2010 | Wander | |
| 2011/0006182 A1 | 1/2011 | Hockema | |
| 2012/0098710 A1 | 4/2012 | Seal | |
| 2012/0114414 A1 | 5/2012 | Jang | |
| 2013/0011194 A1 | 1/2013 | Lorenz | |
| 2013/0212945 A1 | 8/2013 | Lanham | |
| 2013/0301190 A1 | 11/2013 | Metzger | |
| 2014/0144067 A1 | 5/2014 | Shefer | |
| 2014/0268506 A1 | 9/2014 | Emanuel | |
| 2015/0122959 A1 | 5/2015 | Cook | |
| 2015/0197913 A1 * | 7/2015 | Wander | E02D 29/14 455/95 |
| 2016/0069039 A1 | 3/2016 | Johnson | |
| 2016/0094897 A1 | 3/2016 | Kenig | |
| 2017/0023612 A1 | 1/2017 | Brown | |

FOREIGN PATENT DOCUMENTS

| | | |
|---|---|---|
| KR | 200406184 | 1/2006 |
| KR | 100566663 | 3/2006 |
| KR | 20070011703 | 1/2007 |

OTHER PUBLICATIONS

Elan Technologies Inc. Product Sheet, Comcore (R) Manhole Antenna Cover, (2 pages) 2008.
Hubbell Power Systems Power Sheet, "Antenna Covers" 2001.

* cited by examiner

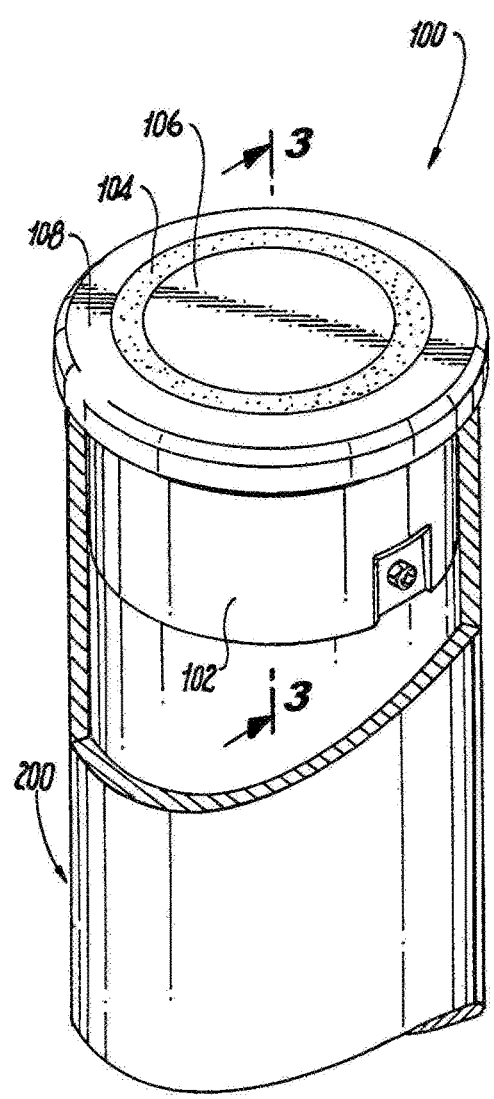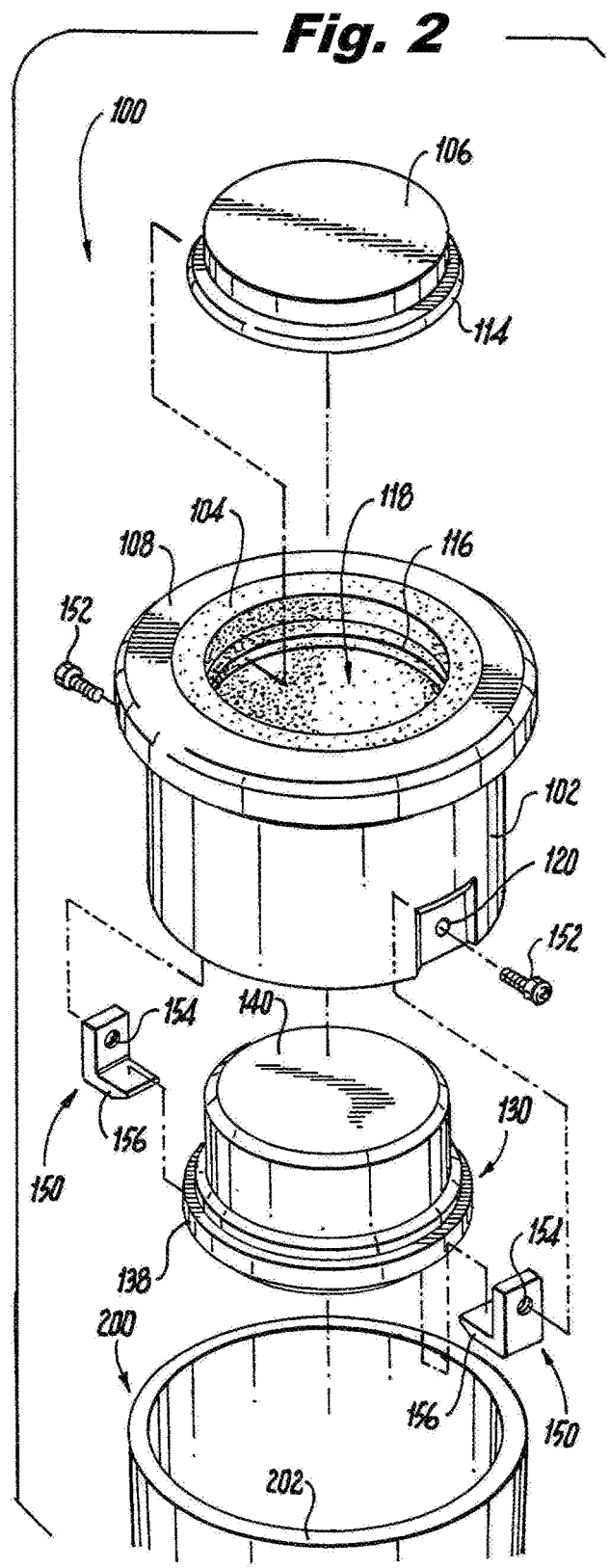

UTILITY COVER FOR USE WITH AUTOMATED METERING EQUIPMENT

CROSS-REFERENCE TO RELATED APPLICATIONS

This application is a 371 of PCT/US2017/052903 filed on Sep. 22, 2017, published on Apr. 12, 2018 under publication number WO 2018/067326 A2, which claims priority benefits from U.S. Provisional Application No. 62/405,091 filed 6 Oct. 2016 entitled "Utility Cover for use with Automated Metering Equipment" the entire contents of both are incorporated herein in their entirety by reference.

BACKGROUND

Field

The present disclosure relates generally to utility covers, and more particularly to utility covers for use with automated metering equipment.

Description of the Related Art

Water, electric and gas utilities often use subterranean passages or tunnels as conduits, with surface access openings. Such surface access openings, sometimes referred to as manholes, are ordinarily covered by utility covers, sometimes referred to as manhole covers. To access the manhole, workers would remove the utility cover from an access opening, and subsequently replace the utility cover over the access opening.

Traditional utility covers are constructed from cast-iron or steel and fit into a mating surface of a manhole ring or frame also made from cast-iron or steel. The utility cover installed onto such a frame can typically endure vehicle and pedestrian traffic.

Smaller covers are used to cover smaller openings used in other applications. For example, smaller openings may provide access to subterranean utility meters or service valves at a street or sidewalk location. When installed, such smaller covers are typically subjected to pedestrian and/or vehicle traffic. The smaller covers are removed temporarily when workmen want access to the underlying utility meters or service valves and replaced when the workmen are done.

Traditional utility cover assemblies cover ground openings and provide a surface to support pedestrian and/or vehicular traffic. In some cases, utility cover assemblies also provide access to subterranean electronic modules, such as automated meter reading equipment and associated radio and antenna systems. However, many traditional utility covers are made entirely of electrically conductive material such as metal and therefore interfere with the transfer (transmission/reception) of electromagnetic signals. Alternative utility cover assemblies may be made of electrically non-conductive material such as polymer concrete which tends to attenuate the transfer (transmission/reception) of electromagnetic signals. Plastic may be "RF transparent." However, the use of plastic in utility covers has attendant problems including possible failure due to exposure to hot paving materials or sunlight. Accordingly, such traditional utility cover assemblies may not be suitable in applications where electromagnetic signals are being emitted and/or received by an electronic module provided below the utility cover.

SUMMARY

The present disclosure provides utility covers that include in one illustrative embodiment a base portion made at least partially from a first material, a center plate made at least partially from a second material capable of acting as a tuning plate for electromagnetic energy and an insulating ring made at least partially from a third material and arranged between the base portion and the center plate. In another illustrative embodiment, the utility covers include a base portion made from a first material, a plate made at least partially from a material capable of re-radiating electromagnetic energy and an insulating ring arranged between the base portion and the plate, the insulating ring electrically isolating the base portion from the plate.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein:

FIG. 1 is perspective view of a utility cover assembly according to an illustrative embodiment of the present disclosure installed in a pipe;

FIG. 2 is an exploded view of the utility cover assembly and pipe of FIG. 1;

DETAILED DESCRIPTION

Figure 3:
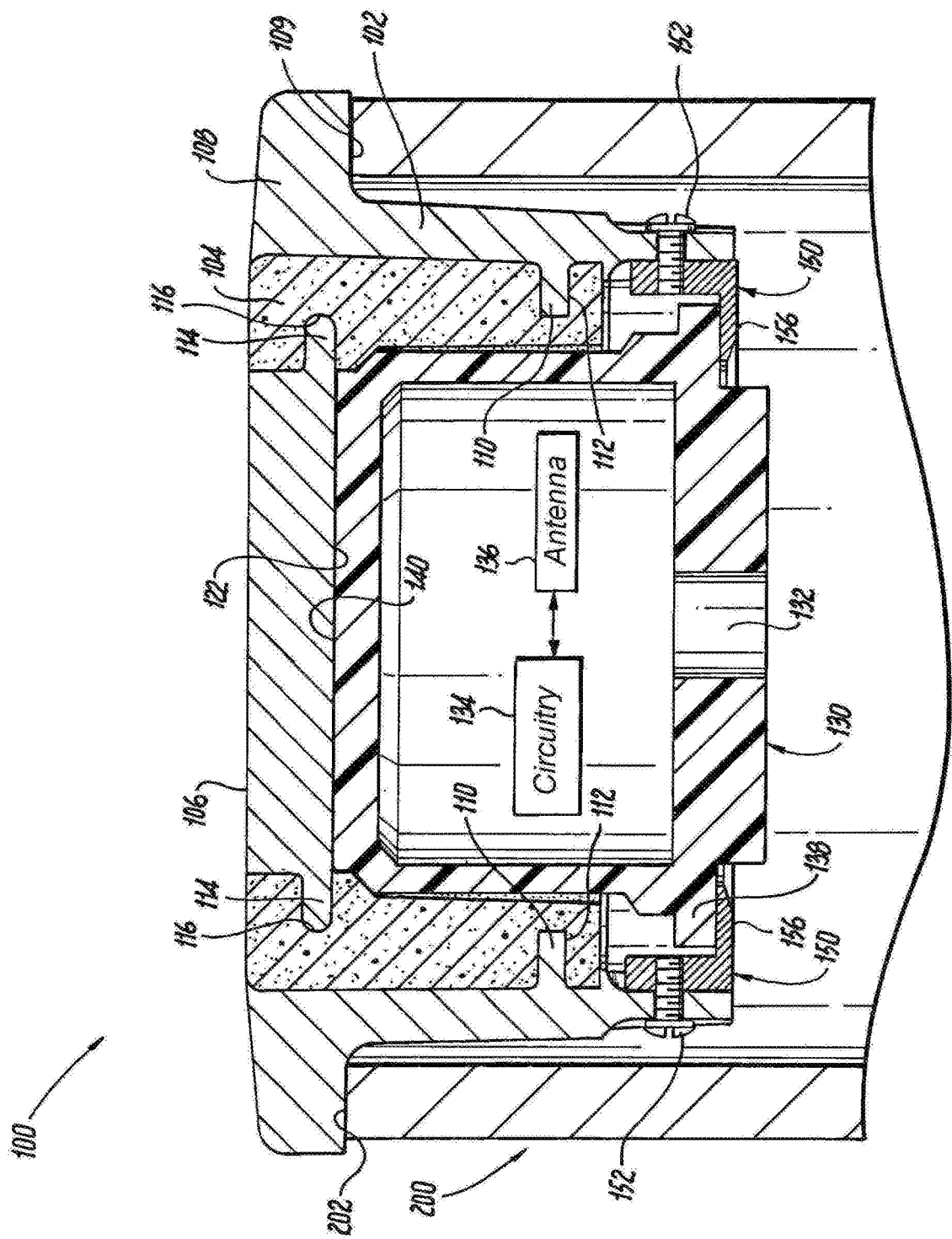
FIG. 3 is a cross sectional view of the utility cover assembly and pipe shown in FIG. 1 taken along line 3-3.
Figure 4:
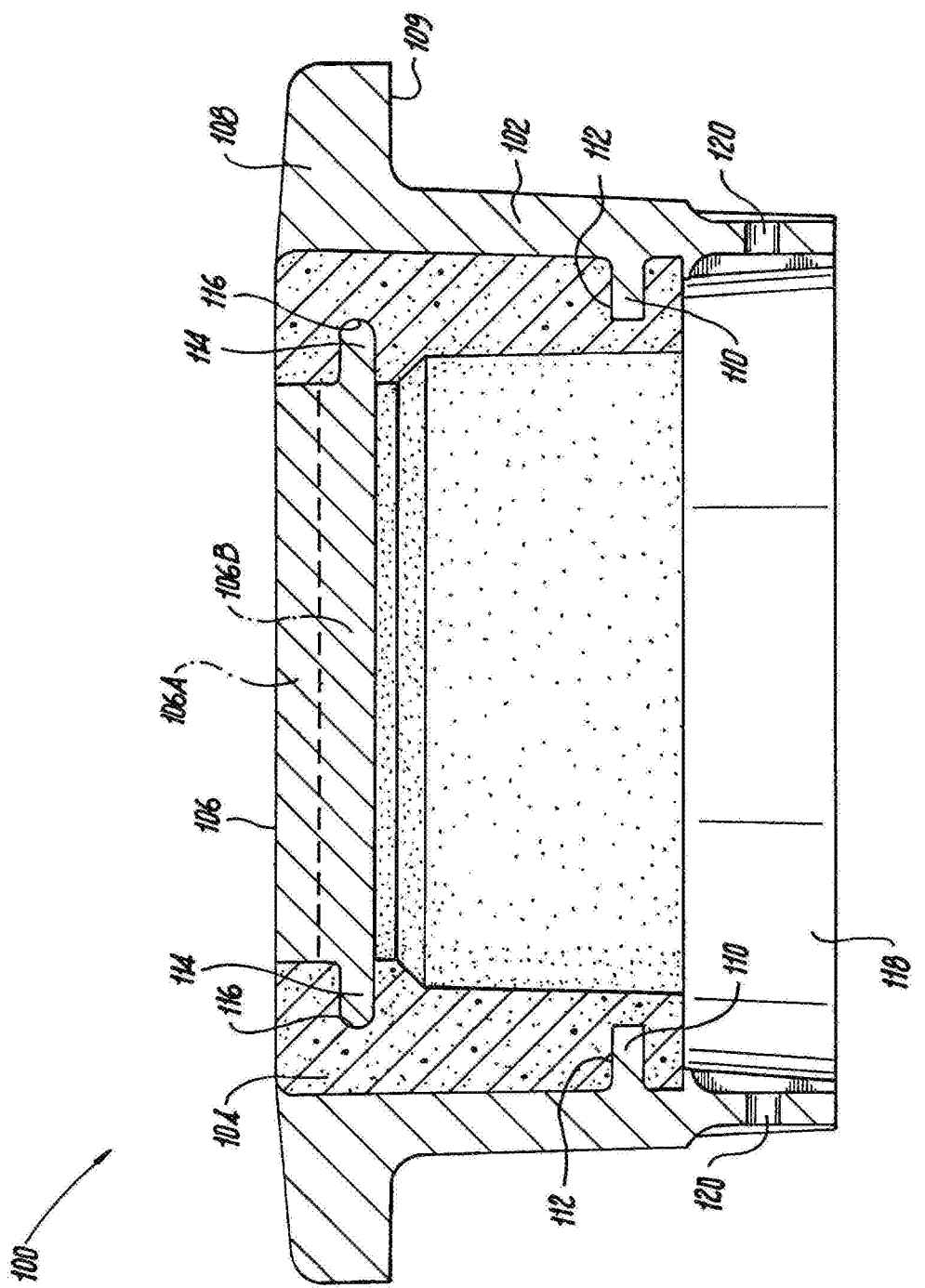
FIG. 4 is a cross sectional view of an illustrative embodiment of the utility cover assembly of FIG. 1.

Illustrative embodiments of the present disclosure relate to utility covers for use with automated metering infrastructure equipment.

Illustrative embodiments of the present disclosure describe utility covers for subterranean utility enclosure systems that provide access to underground utilities and that may include electronic modules that wirelessly communicate through the cover to above-ground receivers.

Illustrative embodiments of the present disclosure utilize a tuning plate to provide augmentation or resonance adjustment of an RF signal that an "RF transparent" cover by itself cannot.

Illustrative embodiments of the present disclosure provide a metal tuning plate in a metal/concrete or concrete assembly eliminating the use of plastic in a utility cover and the attendant problems with failure due to exposure to hot paving materials or sunlight.

Illustrative embodiments of the present disclosure describe utility cover assemblies including those for providing electronic module capabilities to utility enclosure covers while also providing traditional utility cover functionality. The utility cover assemblies as described herein may be utilized to cover, for example, utility meters and/or utility valves including water, gas and electric meters and gas and water valves.

In certain illustrative embodiments, the utility cover is comprised of a base portion and an embedded plate which may be made of an electrically conductive material. An insulating ring made of an electrically non-conductive material is provided between the electrically conductive base portion and the embedded plate. An electronic module may be provided below the plate, the plate serving to tune the frequency of an antenna/cover system and to re-radiate RF signals used by the electronic module.

The electronic module may include a radio receiver and/or transmitter, a power source such as a battery and associated electronic circuitry for processing information and transmitting and/or receiving radio signals through the cover. For example, the electronic module may be a STAR® ZoneScan leak-detection system by Aclara Technologies LLC, located at 77 West Port Plaza Drive, St. Louis, Mo. 63146. Alternatively, other types of electronic modules may be used depending on a particular application.

In certain illustrative embodiments, the utility cover includes a plate which may be made of an electrically conductive material. A base portion is provided which may be made of an electrically conductive material and/or an electrically non-conductive material. An insulating ring made of an electrically non-conductive material may be provided between the base portion and the plate. An electronic module may be provided below the plate, and the plate serves to re-radiate RF signals used by the electronic module.

According to illustrative embodiments of the present disclosure, elements of the utility cover may be made from electrically conductive materials including, for example, cast iron, steel, aluminum, brass, bronze, copper and/or other electrically conductive materials. Certain elements of the utility cover according to illustrative embodiments of the present disclosure may be made from electrically non-conductive materials including, for example, polymer concrete, fiberglass reinforced polymer, polyethylene, concrete, vulcanized rubber, polycarbonate, polyolefin, polypropylene copolymer and/or other electrically non-conductive materials.

A utility cover according to an illustrative embodiment of the present disclosure is shown in FIGS. 1-4. The utility cover 100 includes a base portion 102, an insulating ring 104 and an inner plate 106. The base portion 102 has an upper flange 108 with an overhang 109 shown in FIG. 3, and forms an outer casing for the cover 100. The insulating ring 104 is positioned between the base portion 102 and the inner plate 106. The base portion 102 has a diameter dimensioned to fit within a pipe such as, for example, a cast iron pipe 200 shown in FIG. 1. The pipe 200 may allow access to a valve or meter provided below ground level. The overhang 109 of the upper flange 108 of the base portion 102 has a diameter larger than a diameter of pipe 200 such that utility cover 100 rests on an upper edge 202 of the pipe 200. The upper edge 202 of the pipe 200 may be provided at or just below ground level so that when the utility cover 100 is inserted into the pipe, inner plate 106 remains at or above ground level.

According to an embodiment of the present disclosure, the base portion 102, including upper flange 108, may be made of a metallic material, such as cast iron, steel, aluminum, brass, bronze, copper or other electrically conductive material, or a non-metallic material such as concrete, polymer concrete, fiberglass reinforced polymer concrete, polyethylene, polycarbonate, polyolefin, or polypropylene copolymer. The insulating ring 104 positioned between the base portion 102 and plate 106 is made of a non-conductive material to electrically isolate the base portion 102 from the plate 106. Non-limiting examples of non-conductive materials that may be used to form the insulating ring 104 include polymer concrete, fiberglass reinforced polymer, polyethylene, concrete, vulcanized rubber, polycarbonate, polyolefin, or polypropylene copolymer. The plate 106 is made of an electrically conductive material capable of tuning electromagnetic energy, such as cast iron, steel, aluminum, brass, bronze, copper or other electrically conductive material. That is, the plate 106 acts to tune the frequency response of the antenna/cover system, as described below.

According to an embodiment of the present disclosure, the plate 106 can be permanently attached to the insulating ring 104, and the insulating ring can be permanently attached to the base portion 102 in any suitable manner sufficient to form a unitary utility cover 100. For example, and referring to FIGS. 3 and 4, the utility cover 100 can be maintained together as a unit utilizing a tongue and groove type system. In such a tongue and groove type system, one or more support structures 110, e.g., one or more tongues or flanges, can extend from an inside wall of base portion 102 that are embedded in one or more corresponding grooves 112 in the insulating ring 104. Alternatively, the support structure 110 may be a ring, e.g., a tongue or flange forming a ring, which extends entirely around the inside wall of base portion 102 and is embedded in a ring groove 112 in the insulating ring 104. The support structures 110 may be integrally formed by casting as part of a mold used for forming base portion 102 using, for example, a sand mold. Also forming part of the tongue and groove type system, one or more support structures 114 e.g., one or more tongues or flanges, can extend from the outer periphery of the plate 106 and are embedded in one or more corresponding grooves 116 in the insulating ring 104. Alternatively, the support structure 114 may be a ring e.g., a tongue or flange forming a ring, which extends entirely around the outer periphery of plate 106 and is embedded in a ring groove 116 in the insulating ring 104. The support structures 114 may be integrally formed by casting as part of a mold used for forming the plate 106 using, for example, a sand mold. When insulating ring 104 is formed, it locks the base portion 102 and the plate 106 in place, providing a unitary utility cover 100. Epoxy or other sealing material may be used to further seal the joint between the base portion 102 and the insulating ring 104, and the joint between the insulating ring and the plate 106. The epoxy or other sealing material may be used to further secure the base portion 102 to the insulating ring 104 and the insulating ring to the plate 106.

Referring again to FIGS. 2 and 3, according to an illustrative embodiment of the present disclosure, a meter transmission unit (MTU) 130 may be installed within an opening 118 in the utility cover 100 that is dimensioned to receive the MTU. The MTU 130 may be an acoustic monitoring system, such as the STAR® ZoneScan leak detection system by Aclara Technologies LLC. The MTU 130 may include an acoustic sensor provided at an end of a cable extending from connector 132 of the MTU 130 that is sealed with, for example, a gasket to prevent moisture from entering into the MTU. The acoustic sensor may include a magnet for attaching the sensor to a pipe, meter or valve accessible via pipe 200. The MTU 130 may include signal receiving and/or transmitting circuitry 134 for receiving and/or transmitting data via antenna 136, seen in FIG. 3. Clips 150 may be used to secure the MTU 130 to the utility cover 100, as shown in FIG. 2. More specifically, in the illustrative embodiment shown, screws 152 can extend through holes 120 provided in the base portion 102 and screwed into threaded holes 154 in the clips 150. The clips 150 include arms 156 which engage a base 138 of the MTU 130 holding the MTU in place within the utility cover 100. When the MTU 130 is installed in the utility cover 100, the MTU is slid into the interior opening 118 of the utility cover until an upper portion 140 of the MTU is in close proximity to a lower portion 122 of the plate 106, as shown in FIG. 3.

When MTU 130 is in close proximity to the plate 106, the cover 100 and MTU form a cover/antenna transmission system where the plate 106 acts to tune the frequency response of the system formed by the cover and the antenna in the MTU 130. More specifically, the MTU 130, including the integral antenna 136, is itself designed around a particular frequency range. Placing a standard utility cover over or around the antenna 136 would change the frequency response of the cover/antenna system thus significantly degrading the signal transmitted by the MTU 130 when it passes through a standard utility cover. By positioning the plate 106 in close proximity to the MTU 130 and isolating the plate 106 from the base portion 102 using the insulating ring 104, the plate 106 can effectively adjust the frequency response of the cover/antenna system so that the signal transmitted by the antenna 136 in the MTU 130 and passing through the plate 106 is not significantly degraded. The plate 106 can vary in material, diameter, or thickness to provide the desired frequency adjustment or tuning for a given antenna frequency response. The plate 106 can also act to re-radiate electromagnetic energy, thus improving the range over which the MTU 130 antenna's signal can be transmitted and received compared to a standard utility covers.

In another illustrative embodiment, the plate 106 may be made from different types of conductive materials. For example, the plate 106 may be made from a first conductive material 106A and a second different conductive material 106B shown in dotted lines in FIG. 4. As another example, the plate 106 may be made from a first material 106A that is non-conductive and acts as a protective layer and a second material 106B that is conductive. According to another illustrative embodiment of the present disclosure, only a portion of insulating ring 104 is made of a non-conductive material. For example, the portion of insulating ring 104 that comes into contact with plate 106 may be made of a non-conductive material as described above and the remaining portions that do not make contact with plate 106 may be made of a conductive material as described herein. According to another embodiment of the present disclosure, the base portion 102 and insulating ring 104 can be formed as a single assembly made from one or more of the non-conductive materials described herein.

Figure 5:
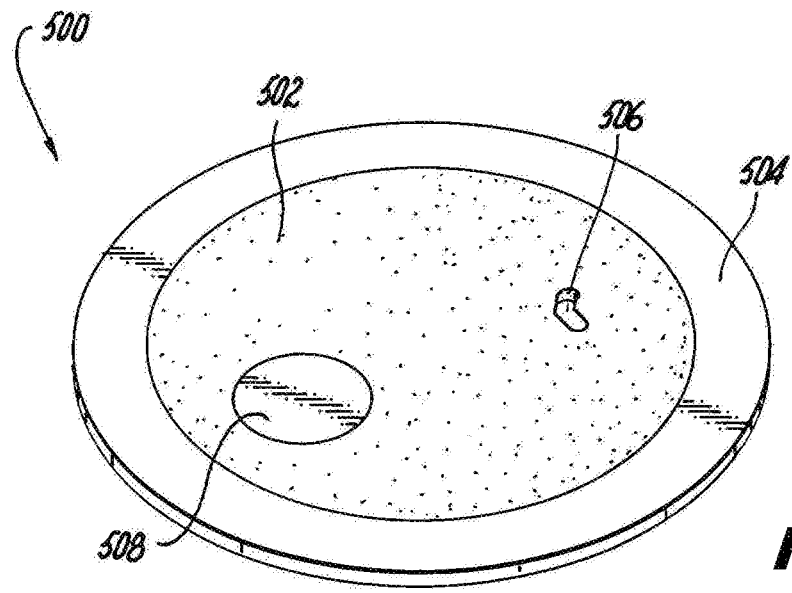
FIG. 5 is a perspective view of a utility cover assembly according to another illustrative embodiment of the present disclosure.

According to other embodiments of the present disclosure, a utility meter or valve cover can be made in various shapes and sizes. For example, according to an embodiment of the present disclosure shown in FIG. 5, utility cover 500 includes an outer ring 504, an inner ring 502 and a plate 508. A keyhole 506 may be provided for allowing utility cover 500 to be easily lifted using, for example, a screwdriver. According to this embodiment of the present disclosure, the outer ring 504 can be made of a metallic material or a non-metallic material as described herein. The plate 508 is made of an electrically conductive material described herein, and the inner ring 502 is made of a non-conductive material described herein. The plate 508 may be permanently attached to inner ring 502 in any suitable manner such as those described herein for the embodiment of FIGS. 1-4. The inner ring 502 electrically isolates the plate 508 from the outer ring 504. The utility cover 500 may be used to cover an electronic module including transmitting and/or receiving circuitry and an antenna. The antenna may be situated just below plate 508 so that plate 508 acts to tune the frequency response of the antenna/cover system and/or to re-radiate RF signals emitted by or received by the antenna, as described above.

Figure 6:
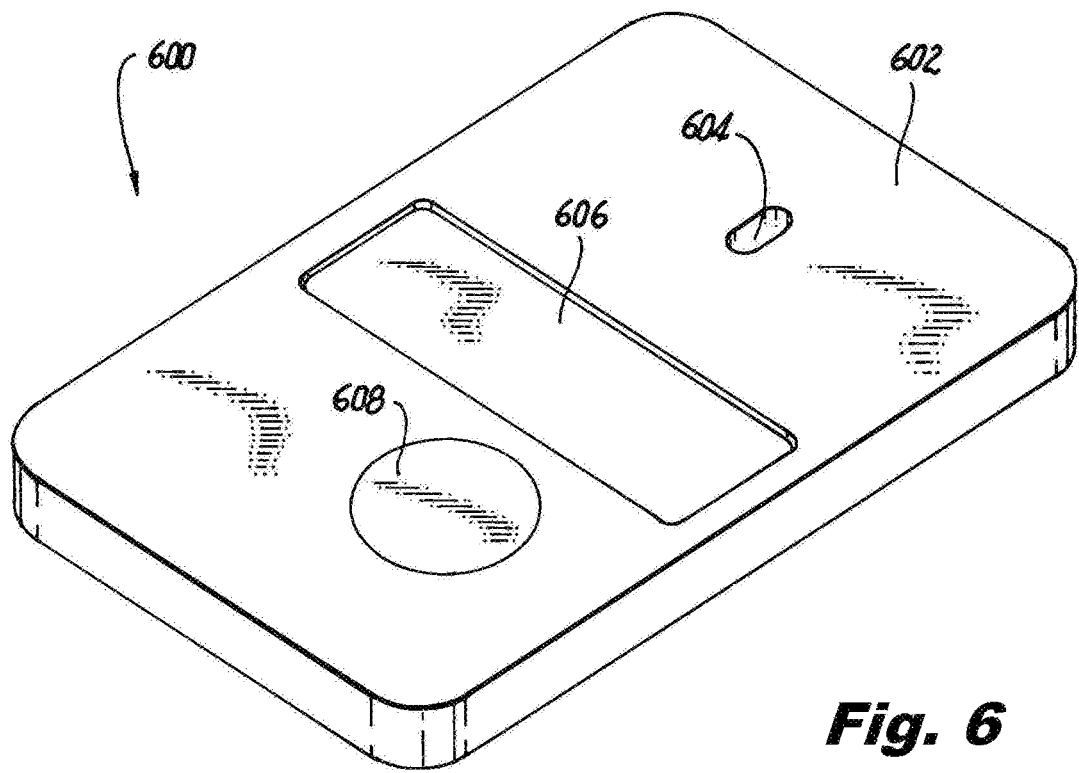
FIG. 6 is a perspective view of a utility cover assembly according to another illustrative embodiment of the present disclosure.
Figure 7:
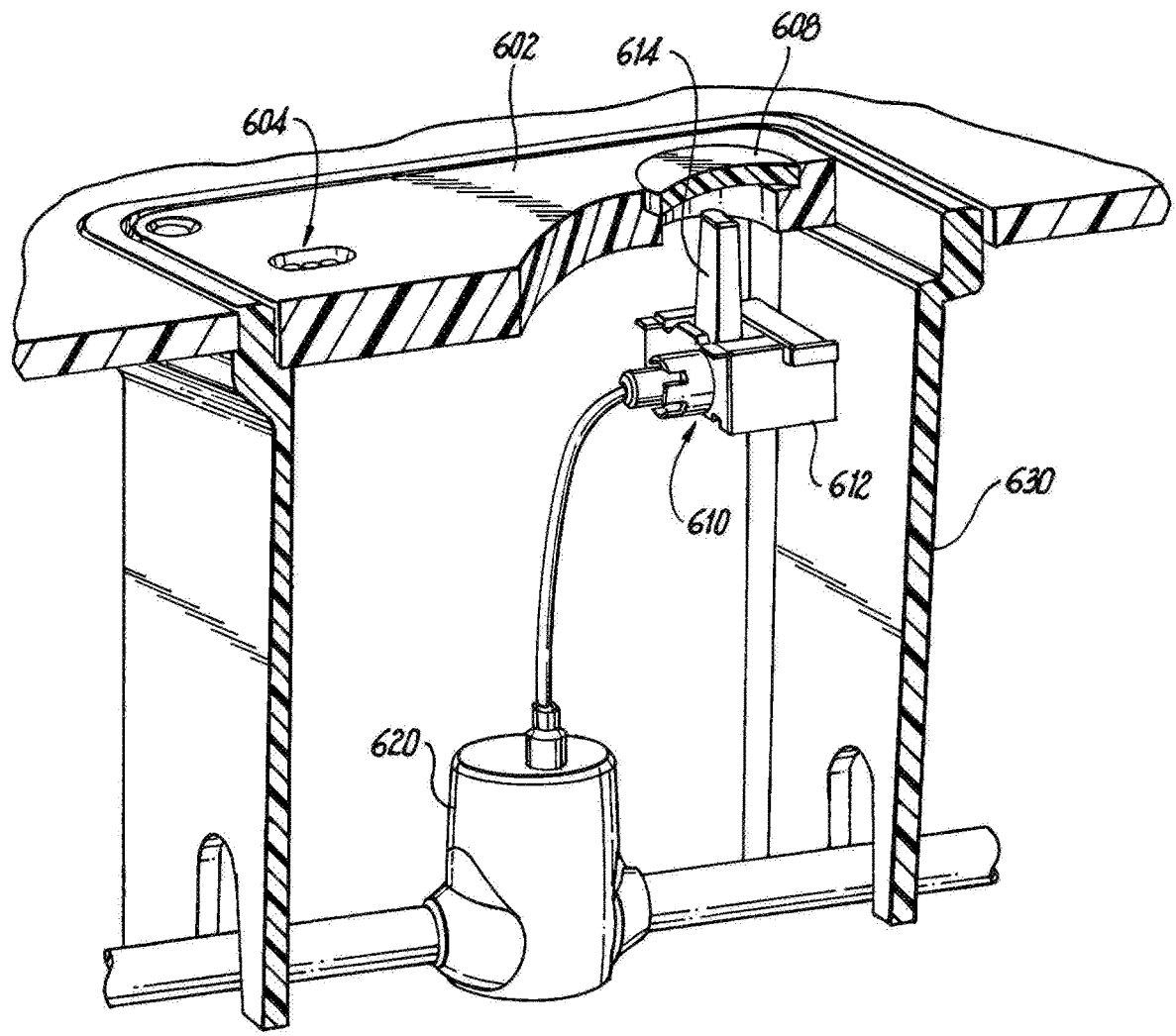
FIG. 7 is a perspective view of the utility cover assembly of FIG. 6 installed on a subterranean enclosure.

According to another embodiment of the present disclosure, a utility meter or valve cover may be in the shape of a rectangle. For example, according to an embodiment of the present disclosure as shown in FIGS. 6 and 7, the utility cover 600 includes a rectangular section 602 and a circular plate section 608. A section 606 may be provided allowing placement of a logo and/or descriptive language indicating the type of meter provided below cover 600. An orifice 604 may be provided allowing rectangular section 602 to be pried up using, for example, a screw driver. According to this embodiment, rectangular section 602 is formed of a non-conductive material as described above. Circular plate 608 is made of a conductive material as described above and may be permanently attached to section 602. The utility cover 600 may be used to cover an electronic module 610 including transmitting and/or receiving circuitry 612 and an antenna 614 that are electrically connected to a meter 620 positioned within an enclosure 630. The antenna 614 may be situated just below plate 608 so that plate 608 acts to tune the frequency response of the antenna/cover system and/or to re-radiate RF signals emitted by or received by the antenna, as described above.

The utility cover assemblies as described herein may be used as utility meter covers (e.g., for water, gas or electric meters), utility valve covers (e.g., for water or gas valves). Utility cover assemblies as described herein may be used anywhere within a metering infrastructure where RF signal transmission and/or reception is utilized. Other exemplary metering or flow measurement systems that may be used with the utility cover assemblies described herein include, for example, metering or flow measurement systems including the Orion® Endpoint system by Badger, located at 4545 W Brown Deer Rd. Milwaukee, Wis. 53224 and metering or sensing systems including the Smartpoint® 520M pit set module by Sensus Inc, located at 8601 Six Forks Road, Raleigh, N.C. 27615.

While illustrative embodiments have been described and illustrated above, it should be understood that these are exemplary and are not to be considered as limiting. Additions, deletions, substitutions, and other modifications can be made without departing from the spirit or scope of the present disclosure. Accordingly, the invention is not to be considered as limited by the foregoing description.

What is claimed is:

1. A utility cover for covering a utility structure housing an antenna, the utility cover comprising:
    a base portion having an interior wall and a central opening defined by the interior wall, the base portion is made at least partially from a first material and configured to be placed on and fit at least partially in the utility structure;
    an insulating ring permanently attached to the interior wall and disposed within the central opening of the base portion, the insulating ring being made from a second material; and
    a plate permanently attached to the insulating ring and covering the central opening so that the insulating ring is between the plate and the base portion, the plate being made at least partially from a third material and having an outer length and thickness at least partially disposed within the interior wall of the base portion such that the plate acts as a tuning plate that tunes the frequency response of a transmission system formed by the plate and the antenna when the base portion is placed on and fit at least partially in the utility structure;
wherein the second material electrically isolates the base portion from the plate.

2. The utility cover of claim 1, wherein the first material and the third material are electrically conductive materials.

3. The utility cover of claim 2, wherein the first material and the third material are different electrically conductive materials.

4. The utility cover of claim 2, wherein the first material and the third material are same electrically conductive materials.

5. The utility cover of claim 1, wherein the base unit and the insulating ring are formed of an electrically non-conductive material.

6. The utility cover of claim 5, wherein the second material is an electrically non-conductive material.

7. The utility cover of claim 1, wherein the first and third materials are selected from a group consisting of cast iron, steel, aluminum, brass, bronze and copper.

8. The utility cover of claim 1, wherein the second material is selected from a group consisting of polymer concrete, fiberglass reinforced polymer, polyethylene, concrete, vulcanized rubber, polycarbonate, polyolefin and polypropylene copolymer.

9. A utility cover assembly for covering a utility structure housing an antenna, the utility cover assembly comprising:
a base portion having an interior wall and a central opening defined by the interior wall, the base portion is made from a metallic material and configured to be placed on and fit at least partially in the utility structure;
an insulating ring attached to the interior wall and disposed within the central opening of the base portion, the insulating ring is made from an electrically non-conductive material; and
a plate positioned within the insulating ring and covering the central opening so that the insulating ring is between the plate and the base portion to electrically isolate the plate from the base portion, the plate being made from an electrically conductive material and having an outer length and thickness such that the plate tunes the frequency response of a transmission system formed by the plate and the antenna when the base portion is placed on and fit at least partially in the utility structure.

10. The utility cover of claim 9, wherein the base portion and the plate are made from a same material.

11. The utility cover of claim 9, wherein the metallic material comprises an electrically conductive material.

12. The utility cover of claim 9, wherein the base portion and plate are made from materials selected from a group consisting of cast iron, steel, aluminum, brass, bronze and copper.

13. The utility cover of claim 9, wherein the insulating ring is made from the electrically non-conductive material selected from a group consisting of polymer concrete, fiberglass reinforced polymer, polyethylene, concrete, vulcanized rubber, polycarbonate, polyolefin and polypropylene copolymer.

14. A utility cover assembly for covering a utility structure housing an antenna, the utility cover assembly comprising:
a base portion made from an electrically non-conductive material and configured to be placed on and fit at least partially in the utility structure; and
a plate positioned within the base portion, the plate being made from an electrically conductive material and having an outer length and thickness that provide a frequency adjustment relative to the antenna disposed underneath and near the plate such that the plate tunes the frequency response of a transmission system formed by the plate and the antenna when the base portion is placed on and fit at least partially in the utility structure.

15. The utility cover assembly of claim 14, wherein the plate is permanently attached to the base portion.

16. The utility cover assembly of claim 14, wherein the electrically conductive material is selected from a group consisting of cast iron, steel, aluminum, brass, bronze and copper.

17. The utility cover assembly of claim 14, wherein the electrically non-conductive material is selected from a group consisting of cast iron, steel, aluminum, brass, bronze and copper polymer concrete, fiberglass reinforced polymer, polyethylene, concrete, vulcanized rubber, polycarbonate, polyolefin, or polypropylene copolymer.

* * * * *